(12) United States Patent
Grunthaner et al.

(10) Patent No.: US 9,495,048 B2
(45) Date of Patent: *Nov. 15, 2016

(54) HIGH RESISTIVITY METAL FAN OUT

(71) Applicant: Apple Inc., Cupertino, CA (US)

(72) Inventors: Martin Paul Grunthaner, Los Altos Hills, CA (US); Lili Huang, San Jose, CA (US)

(73) Assignee: Apple Inc., Cupertino, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 14/163,899

(22) Filed: Jan. 24, 2014

(65) Prior Publication Data
US 2014/0139763 A1    May 22, 2014

Related U.S. Application Data

(63) Continuation of application No. 12/135,038, filed on Jun. 6, 2008, now Pat. No. 9,069,418.

(51) Int. Cl.
*G06F 3/041*   (2006.01)
*G06F 3/044*   (2006.01)

(52) U.S. Cl.
CPC .................................. *G06F 3/044* (2013.01)

(58) Field of Classification Search
CPC ........................................................ G06F 3/044
USPC ................. 345/156–184; 178/18.01–18.06; 349/149, 150; 361/784, 803
See application file for complete search history.

(56) References Cited

U.S. PATENT DOCUMENTS 3,773,989 A    11/1973  Hacon
5,062,916 A *  11/1991  Aufderheide et al. ........ 156/269
5,239,152 A *  8/1993   Caldwell et al. ............. 200/600
5,483,261 A    1/1996   Yasutake
5,488,204 A    1/1996   Mead et al.
5,825,352 A    10/1998  Bisset et al.

(Continued)

FOREIGN PATENT DOCUMENTS

CN    1902538 A     1/2007
CN    101059737 A   10/2007

(Continued)

OTHER PUBLICATIONS

European Search Report mailed Oct. 28, 2014, for EP Patent Application No. 14168254.2, filed Jun. 1, 2009, three pages.

(Continued)

*Primary Examiner* — Prabodh M Dharia

(74) *Attorney, Agent, or Firm* — Morrison & Foerster LLP

(57) ABSTRACT

The formation of metal traces in the border areas of a touch sensor panel to provide improved reliability, better noise rejection, and lower manufacturing costs is disclosed. The metal traces can be coupled to rows on the touch sensor panel in an interleaved manner, so that any two successive rows can be coupled to metal traces in border areas on opposite sides of the touch sensor panel. In addition, by utilizing the full width available in the border areas in some embodiments, the metal traces can be formed from higher resistivity metal, which can reduce manufacturing costs and improve trace reliability. The wider traces can also provide better noise immunity from noise sources such as an LCD by providing a larger fixed-potential surface area and by more effectively coupling the drive lines to the fixed potential.

16 Claims, 6 Drawing Sheets

(56) References Cited

U.S. PATENT DOCUMENTS

| | | | |
|---|---|---|---|
| 5,835,079 A | 11/1998 | Shieh | |
| 5,869,791 A * | 2/1999 | Young | 178/20.01 |
| 5,880,411 A | 3/1999 | Gillespie et al. | |
| 5,994,766 A | 11/1999 | Shenoy et al. | |
| 6,188,391 B1 | 2/2001 | Seely et al. | |
| 6,297,811 B1 | 10/2001 | Kent et al. | |
| 6,310,610 B1 | 10/2001 | Beaton et al. | |
| 6,323,846 B1 | 11/2001 | Westerman et al. | |
| 6,690,387 B2 | 2/2004 | Zimmerman et al. | |
| 7,015,894 B2 | 3/2006 | Morohoshi | |
| 7,075,505 B2 | 7/2006 | Sakaguchi et al. | |
| 7,117,464 B2 | 10/2006 | Frank et al. | |
| 7,184,064 B2 | 2/2007 | Zimmerman et al. | |
| 7,321,362 B2 | 1/2008 | Bottari et al. | |
| 7,339,579 B2 * | 3/2008 | Richter | G06F 3/045 178/18.01 |
| 7,423,621 B2 | 9/2008 | Lin et al. | |
| 7,663,607 B2 | 2/2010 | Hotelling et al. | |
| 7,705,952 B2 | 4/2010 | Lee et al. | |
| 7,755,176 B1 | 7/2010 | St. Amand et al. | |
| 8,179,353 B2 | 5/2012 | Imajo et al. | |
| 8,194,044 B2 * | 6/2012 | Richter | G06F 3/045 178/18.01 |
| 8,255,830 B2 | 8/2012 | Ording et al. | |
| 8,479,122 B2 | 7/2013 | Hotelling et al. | |
| 9,069,418 B2 | 6/2015 | Grunthaner et al. | |
| 2003/0134095 A1 | 7/2003 | Bottari et al. | |
| 2004/0149377 A1 | 8/2004 | Bottari et al. | |
| 2005/0126831 A1 * | 6/2005 | Richter | G06F 3/045 178/18.01 |
| 2006/0087379 A1 | 4/2006 | Bartley et al. | |
| 2006/0189123 A1 | 8/2006 | Saitou et al. | |
| 2006/0197753 A1 | 9/2006 | Hotelling | |
| 2007/0115263 A1 | 5/2007 | Taylor et al. | |
| 2007/0120471 A1 * | 5/2007 | Yamazaki et al. | 313/506 |
| 2007/0222763 A1 * | 9/2007 | Spath | 345/173 |
| 2007/0271399 A1 | 11/2007 | Peng et al. | |
| 2008/0100592 A1 | 5/2008 | Shigeno et al. | |
| 2008/0117182 A1 * | 5/2008 | Um et al. | 345/173 |
| 2008/0143683 A1 * | 6/2008 | Hotelling | G06F 3/0416 345/173 |
| 2008/0158181 A1 | 7/2008 | Hamblin et al. | |
| 2008/0165158 A1 | 7/2008 | Hotelling et al. | |
| 2008/0309633 A1 | 12/2008 | Hotelling et al. | |
| 2009/0091551 A1 | 4/2009 | Hotelling et al. | |
| 2009/0107736 A1 * | 4/2009 | Ben-Eliyahu | G06F 3/044 178/18.01 |
| 2009/0143141 A1 * | 6/2009 | Wells et al. | 463/37 |
| 2009/0153509 A1 * | 6/2009 | Jiang et al. | 345/173 |
| 2009/0219258 A1 * | 9/2009 | Geaghan | G06F 3/044 345/173 |
| 2009/0266621 A1 | 10/2009 | Huang et al. | |
| 2009/0303189 A1 | 12/2009 | Grunthaner et al. | |
| 2009/0314621 A1 | 12/2009 | Hotelling | |
| 2010/0013800 A1 | 1/2010 | Elias et al. | |
| 2010/0079384 A1 * | 4/2010 | Grivna | 345/173 |
| 2010/0166287 A1 * | 7/2010 | Ramer | G06K 9/00127 382/133 |
| 2011/0074705 A1 | 3/2011 | Yousefpor et al. | |
| 2011/0163764 A1 | 7/2011 | Shank et al. | |
| 2011/0298731 A1 | 12/2011 | Fu et al. | |
| 2012/0092273 A1 | 4/2012 | Lyon et al. | |
| 2013/0038572 A1 * | 2/2013 | Frey | G06F 3/044 345/174 |

FOREIGN PATENT DOCUMENTS

| | | |
|---|---|---|
| CN | 101162418 A | 4/2008 |
| JP | 03-015433 U | 2/1991 |
| JP | 2000-163031 A | 6/2000 |
| JP | 2002-342033 A | 11/2002 |
| JP | 2004-296297 A | 10/2004 |
| JP | 2008-009920 A | 1/2008 |
| KR | 20020011716 A | 2/2002 |
| WO | WO-96/18179 A1 | 6/1996 |
| WO | WO-2005/073791 A1 | 8/2005 |
| WO | WO-2005/114369 A3 | 12/2005 |
| WO | WO-2007/008518 A | 1/2007 |
| WO | WO-2009/149014 A1 | 12/2009 |

OTHER PUBLICATIONS

Final Office Action mailed Jul. 3, 2014, for U.S. Appl. No. 13/007,493, filed Jan. 14, 2011, 19 pages.

Non-Final Office Action mailed Sep. 17, 2014, for U.S. Appl. No. 12/135,038, filed Jun. 6, 2008, seven pages.

Notice of Allowance mailed Mar. 12, 2015, for U.S. Appl. No. 12/135,038, filed Jun. 6, 2008, ten pages.

European Search Report mailed Apr. 19, 2012, for EP Patent Application No. 12158277.9, four pages.

European Search Report mailed Feb. 4, 2013, for EP Patent Application No. 12195666.8, five pages.

Final Office Action mailed Apr. 19, 2012, for U.S. Appl. No. 12/135,038, filed Jun. 6, 2008, eight pages.

Final Office Action mailed Nov. 6, 2013, for U.S. Appl. No. 12/135,038, filed Jun. 6, 2008, 14 pages.

International Search Report mailed Jul. 23, 2009, for PCT Patent Application No. PCT/US2009/045843, filed Jun. 1, 2009, two pages.

Lee, S.K. et al. (Apr. 1985). "A Multi-Touch Three Dimensional Touch-Sensitive Tablet," *Proceedings of CHI: ACM Conference on Human Factors in Computing Systems*, pp. 21-25.

Non-Final Office Action mailed Sep. 29, 2011, for U.S. Appl. No. 12/135,038, filed Jun. 6, 2008, seven pages.

Non-Final Office Action mailed Jun. 19, 2013, for U.S. Appl. No. 12/135,038, filed Jun. 6, 2008, 9 pages.

Non-Final Office Action mailed Dec. 16, 2013, for U.S. Appl. No. 13/007,493, filed Jan. 14, 2011, 16 pages.

Rubine, D.H. (Dec. 1991). "The Automatic Recognition of Gestures," CMU-CS-91-202, Submitted in Partial Fulfillment of the Requirements for the Degree of Doctor of Philosophy in Computer Science at Carnegie Mellon University, 285 pages.

Rubine, D.H. (May 1992). "Combining Gestures and Direct Manipulation," CHI '92, pp. 659-660.

Westerman, W. (Spring 1999). "Hand Tracking, Finger Identification, and Chordic Manipulation on a Multi-Touch Surface," A Dissertation Submitted to the Faculty of the University of Delaware in Partial Fulfillment of the Requirements for the Degree of Doctor of Philosophy in Electrical Engineering, 364 pages.

Non-Final Office Action mailed Jan. 16, 2015, for U.S. Appl. No. 13/007,493, filed Jan. 14, 2011, 21 pages.

Chinese Search Report mailed May 6, 2015, for CN Patent Application No. 201210581912.3, filed Jun. 1, 2009, with English translation, four pages.

Final Office Action mailed Jul. 2, 2015, for U.S. Appl. No. 13/007,493, filed Jan. 14, 2011, 22 pages.

Non-Final Office Action mated Jan. 4, 2016, for U.S. Appl. No. 13/007,493, filed Jan. 14, 2011, 20 pages.

Chinese Search Report dated Sep. 6, 2016, for CN Patent Application No. 201210581912.3, filed Jun. 1, 2009, with English translation, four pages.

\* cited by examiner

HIGH RESISTIVITY METAL FAN OUT

CROSS REFERENCE TO RELATED APPLICATIONS

This application is a continuation of granted U.S. patent application Ser. No. 12/135,038, filed Jun. 6, 2008 and issued on Jun. 30, 2015 as U.S. Pat. No. 9,069,418, the contents of which are incorporated herein by reference in their entirety for all purposes.

FIELD OF THE INVENTION

This relates generally to the formation of metal traces on substrates, and more particularly, to the formation of metal traces in the border areas of a touch sensor panel in a manner that allows for higher resistivity conductive materials to be used to improve trace reliability, reduce noise, and lower manufacturing costs.

BACKGROUND OF THE INVENTION

Many types of input devices are presently available for performing operations in a computing system, such as buttons or keys, mice, trackballs, joysticks, touch sensor panels, touch screens and the like. Touch screens, in particular, are becoming increasingly popular because of their ease and versatility of operation as well as their declining price. Touch screens can include a touch sensor panel, which can be a clear panel with a touch-sensitive surface, and a display device such as a liquid crystal display (LCD) that can be positioned partially or fully behind the panel so that the touch-sensitive surface can cover at least a portion of the viewable area of the display device. Touch screens can allow a user to perform various functions by touching the touch sensor panel using a finger, stylus or other object at a location dictated by a user interface (UI) being displayed by the display device. In general, touch screens can recognize a touch event and the position of the touch event on the touch sensor panel, and the computing system can then interpret the touch event in accordance with the display appearing at the time of the touch event, and thereafter can perform one or more actions based on the touch event.

Mutual capacitance touch sensor panels can be formed from a matrix of drive and sense lines of a substantially transparent conductive material such as Indium Tin Oxide (ITO), often arranged in rows and columns in horizontal and vertical directions on a substantially transparent substrate. In some touch sensor panel designs, the substantially transparent drive and/or sense lines can be routed to one edge of the substrate for off-board connections using metal traces in the border areas of the substrate where transparency may not be required. Because these metal traces are thin, low resistance conductive material may be needed. To create such traces, multiple layers of conductive material may be needed to adhere low resistance material to the substrate and form the traces. However, the processing of multiple layers can increase manufacturing costs. In addition, there can be reliability issues involved in the fabrication of stackups of these thin metal layers. Furthermore, these thin metal traces do not provide maximum shielding from noise sources such as the LCD.

SUMMARY OF THE INVENTION

This relates to the formation of metal traces in the border areas of a touch sensor panel to provide improved reliability, better noise rejection, and lower manufacturing costs. The metal traces can be coupled to rows on the touch sensor panel in an interleaved manner, so that any two successive rows can be coupled to metal traces in border areas on opposite sides of the touch sensor panel. In addition, by utilizing the full width available in the border areas in some embodiments, the metal traces can be formed from higher resistivity metal, which can reduce manufacturing costs and improve trace reliability. The wider traces can also provide better noise immunity from noise sources such as an LCD by providing a larger fixed-potential surface area and by more effectively coupling the drive lines to the fixed potential.

By making the metal traces fill up the available width of the border areas, the traces can be wider and thus the overall line resistance of the trace can be lower, or the resistivity of the material can be increased for the same overall line resistance. For example, a single thicker and wider layer of Molybdenum/Niobium (Mo/Nb) having a thickness of about 3000-5000 Å can be formed on a substrate. The higher resistivity of Mo/Nb is compensated for by the increased width and height of the Mo/Nb layer. After the Mo/Nb layer is deposited at the preferred thickness, it can be patterned (etched) to form traces. A layer of conductive material such as ITO can then be formed over the Mo/Nb layer. A conductive material layer can then be patterned to form the drive or sense lines that couple to the metal traces, and can also be patterned over the Mo/Nb traces to form another protective layer for the Mo/Nb traces. A protective layer of material such as silicon oxide ($SiO_2$) can then be formed over the Mo/Nb layer and the conductive material layer.

In general, the ability to use higher resistivity material enables more flexibility in the material stack. For example, in two conductive layer embodiments, manufacturing costs can be reduced as compared to three-layer stackups of thin, higher conductivity material. The fewer number of conductive layers also reduces the problem of side wall control present in when multi-layer stackups are patterned. In addition, the wider, thicker traces are generally of higher reliability, because etching defects, corrosion or other environmental effects may not create problems as easily as if the traces were thinner.

Although the embodiments described above utilize higher resistivity conductive material, such material need not be used. If low resistivity material is used to form the wide traces, the line resistance can be made even lower. This reduced line resistance can produce a better coupling to ground (or some fixed potential) for the wide row traces, improving the noise shielding effectiveness of the rows. Alternatively, a low resistance material can be used with the traces widths kept thin. The thin metal traces can enable a reduction in the width of the touch sensor panel. For example, a thinned three-layer stackup including low resistance material can be used, and in some cases may be less expensive than to develop an alternate chemistry two-layer stackup.

DETAILED DESCRIPTION OF THE PREFERRED EMBODIMENTS

In the following description of preferred embodiments, reference is made to the accompanying drawings which form a part hereof, and in which it is shown by way of illustration specific embodiments in which the invention can be practiced. It is to be understood that other embodiments can be used and structural changes can be made without departing from the scope of the embodiments of this invention.

This relates to the formation of metal traces in the border areas of a touch sensor panel to provide improved reliability, better noise rejection, and lower manufacturing costs. The metal traces can be coupled to rows on the touch sensor panel in an interleaved manner, so that any two successive rows can be coupled to metal traces in border areas on opposite sides of the touch sensor panel. In addition, by utilizing the full width available in the border areas, the metal traces can be formed from higher resistivity metal, which can reduce manufacturing costs and improve trace reliability. The wider traces can also provide better noise immunity from noise sources such as an LCD by providing a larger fixed-potential surface area and by more effectively coupling the drive lines to the fixed potential.

Although embodiments of the invention may be described and illustrated herein in terms of mutual capacitance touch sensor panels, it should be understood that embodiments of this invention are not so limited, but are additionally applicable to self-capacitance sensor panels, and both single and multi-touch sensor panels in which the fabrication of metal traces in the border areas of a touch sensor panel is required. Furthermore, although embodiments of the invention may be described and illustrated herein in terms of double-sided ITO (DITO) touch sensor panels, it should be understood that embodiments of the invention are also applicable to other touch sensor panel configurations, such as configurations in which the drive and sense lines are formed on different substrates or on the back of a cover glass, configurations in which the drive and sense lines are formed on the same side of a single substrate, and configurations in which the drive and sense lines are formed in geometries other than rows and columns.

Figure 1A:
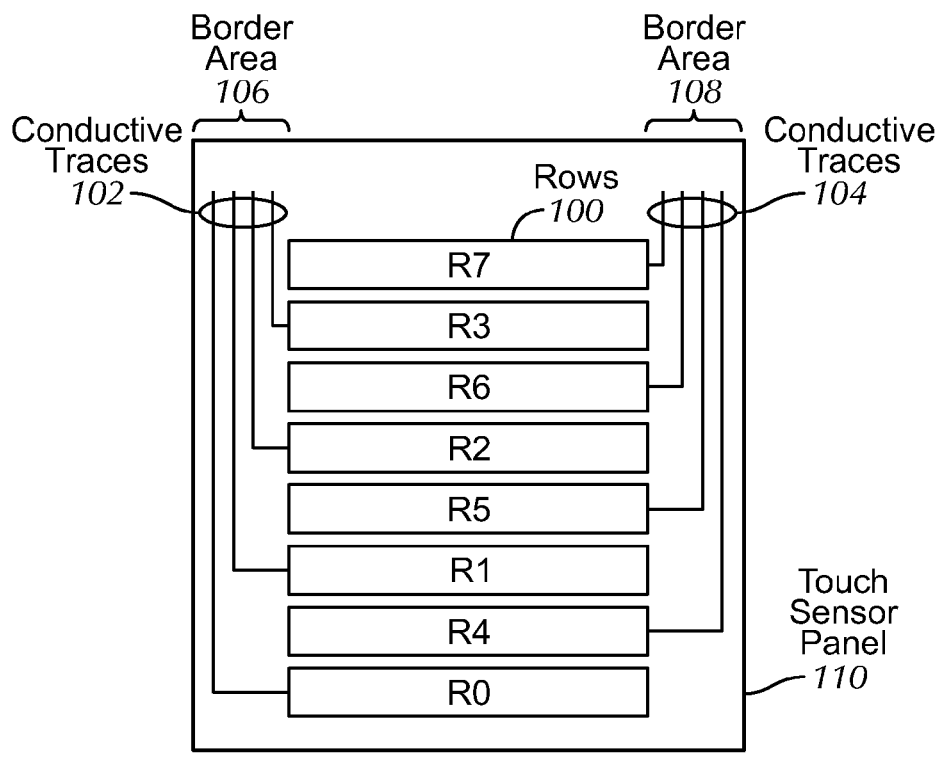
FIG. 1a illustrates a top view of row traces representing either drive or sense lines and metal traces represented symbolically as thin lines in border areas of a touch sensor panel according to embodiments of the invention.

FIG. 1a illustrates a top view of row traces (R0-R7) 100 representing either drive or sense lines, and conductive traces 102 and 104 represented symbolically as thin lines in border areas 106 and 108 of touch sensor panel 110 according to embodiments of the invention. To make full use of the length of border areas 106 and 108, in some embodiments row traces 100 can be coupled to metal traces 102 and 104 in an interleaved manner as shown in FIG. 1a, which results in some metal traces running the full length of touch sensor panel 110. However, in alternative embodiments, interleaving need not be employed, and the metal traces can be routed in either or both of the border areas on either side of the touch sensor panel. In the example of FIG. 1a, rows R0, R1, R2 and R3 are coupled to metal traces 102 in left border area 106, while interleaved rows R4, R5, R6 and R7 are coupled to metal traces 104 in right border area 108. Note that the row designations R0-R7 in FIG. 1a are merely exemplary, and that other row designations (such as sequentially from R0 to R7 from bottom to top) are also possible.

Figure 1B:
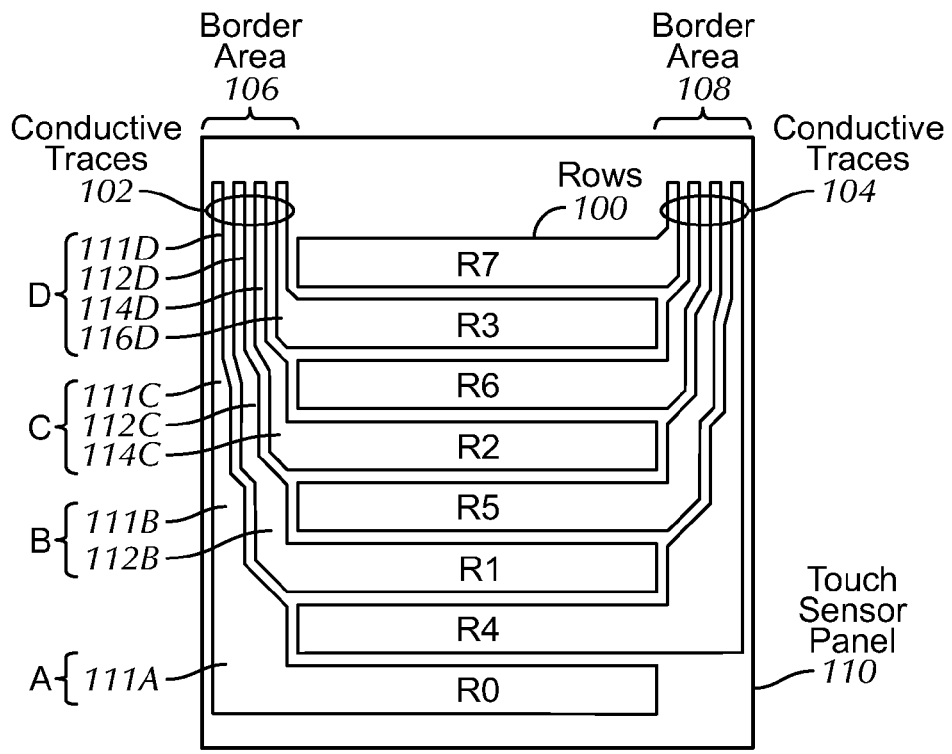
FIG. 1b illustrates the exemplary touch sensor panel of FIG. 1a, with metal traces drawn with representative widths (not to scale) according to embodiments of the invention.

FIG. 1b illustrates the exemplary touch sensor panel 110 of FIG. 1a, with conductive traces 102 and 104 drawn with representative widths (not to scale) according to embodiments of the invention. In the example of FIG. 1b, to make full use of the width of border areas 106 and 108, conductive traces 102 and 104 can be made wider in accordance with the number of traces present at any location along the length of touch sensor panel 110. For example, at location A (alongside row R0 and R4), only one metal trace is present, so trace portion 111-A fills the entire available border area. At location B (alongside row R1 and R5), two metal traces are present, so the two trace portions 111-B and 112-B can be made the same width, wide enough to fill the entire available border area except for separation areas between traces. At location C (alongside row R2 and R6), three metal traces are present, so the three trace portions 111-C, 112-C and 114-C can be made the same width, wide enough to fill the entire available border area except for separation areas between traces. At location D (alongside row R3 and R7), four metal traces are present, so the four trace portions 111-D, 112-D, 114-D and 116-D can be made the same width, wide enough to fill the entire available width of the available border area except for separation areas between traces. A similar trace construction can be utilized for metal traces 104 in border area 108. Although the embodiment of FIG. 1b shows metal traces being made the same width to fill up the available border area, in alternative embodiments the traces need not be of equal width. For example, the longer traces may be wider than the shorter traces.

By making metal traces 102 and 104 fill up the available width of border areas 106 and 108, the traces can be wider and thus the overall line resistance of the trace can be lower, or the resistivity of the material can be increased for the same overall line resistance. For example, instead of using a Molybdenum/Aluminum/Molybdenum (Mo/Al/Mo) stackup at 0.4 ohms per square for the metal traces, a material having a resistivity of 1.0 ohms per square can be used.

Figure 1C:
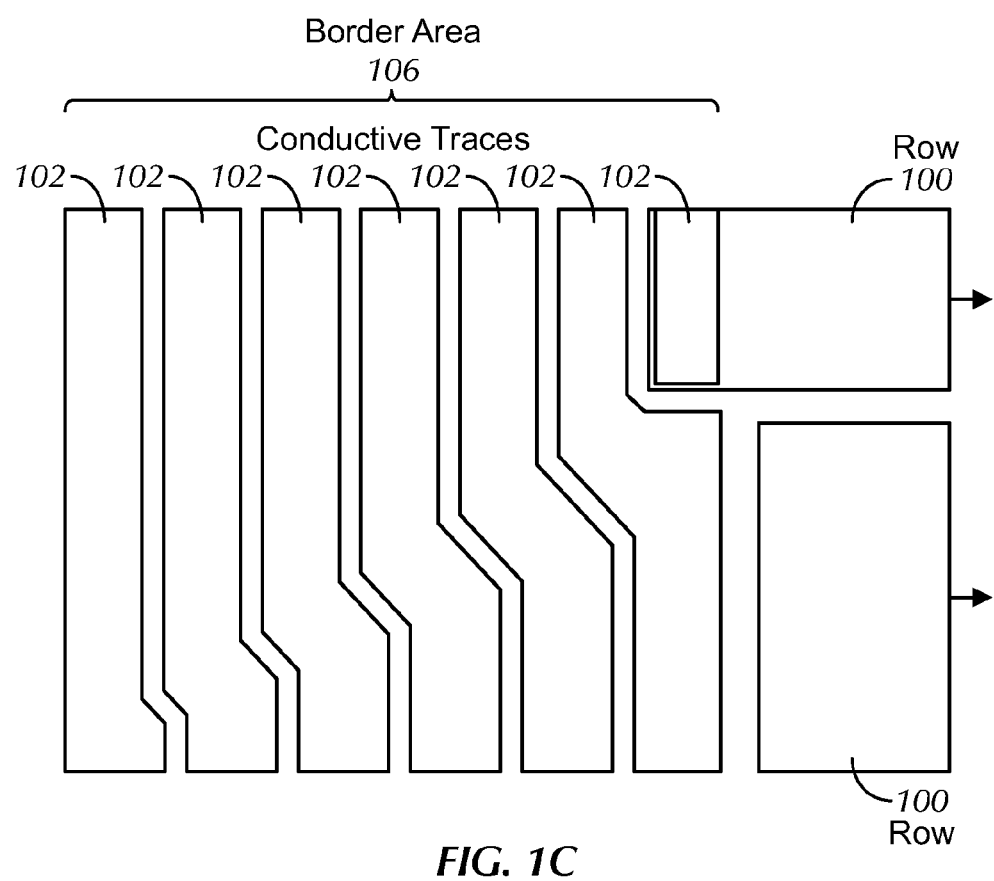
FIG. 1c illustrates a close up view of an exemplary location of a border area at which a transition from six to seven metal traces is occurring according to embodiments of the invention.

FIG. 1c illustrates a close up view of an exemplary location of a border area portion 106 at which a transition from six to seven conductive traces 102 is occurring according to embodiments of the invention. As the example of FIG. 1c illustrates, at each point where the traces need to be narrowed, an angled routing scheme can be used to avoid right-angled routing and to ensure that trace widths are maintained, although it should be understood that a right-angled routing scheme is not required.

Figure 2A:
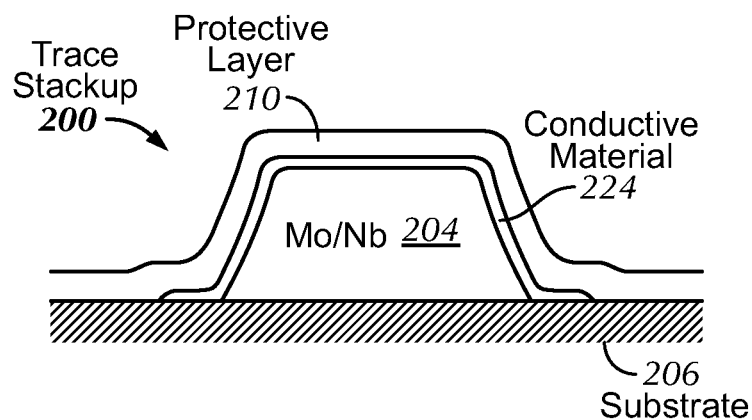
FIG. 2a illustrates an exemplary stackup of higher resistivity material that can be used to form wide traces in the border areas of a touch sensor panel according to embodiments of the invention.

FIG. 2a illustrates an exemplary stackup 200 of higher resistivity material that can be used to form wide traces in the border areas of a touch sensor panel according to embodiments of the invention. In the example of FIG. 2a, a single thicker and wider layer of Molybdenum/Niobium (Mo/Nb) 204 having a thickness of about 3000-5000 Å can be formed on substrate 206. The higher resistivity of Mo/Nb is compensated for by the increased width and height of the Mo/Nb layer. After Mo/Nb layer 204 is deposited at the preferred thickness, it can be patterned (etched) to form traces. A layer of conductive material 224 such as ITO can then be formed over Mo/Nb layer 204. Conductive material layer 224 can be patterned to form the drive or sense lines that couple to the metal traces, and can also be patterned over Mo/Nb traces 204 to form another protective layer for the Mo/Nb traces. Note that although FIG. 2a shows conductive material 224 formed over Mo/Nb layer 204, in alternative embodiments the reverse stackup can also be used. In other words, the Mo/Nb layer can be formed over the conductive material. A protective layer of material 210 such as silicon oxide ($SiO_2$) can then be formed over Mo/Nb layer 204 and conductive material layer 224. Typical thicknesses for the materials of stackup 200 can be about 3000-5000 Å for Mo/Nb layer 204, about 100-200 Å for conductive material layer 224, and about 300-1000 Å for protective layer 210.

In general, the ability to use higher resistivity material enables more flexibility in the material stack. For example, because the embodiment of FIG. 2a utilizes only two conductive layers, manufacturing costs can be reduced as compared to three-layer stackups of thin, higher conductivity material. The fewer number of conductive layers also reduces the problem of side wall control present in when multi-layer stackups are patterned. In addition, the wider, thicker traces are generally of higher reliability, because etching defects, corrosion or other environmental effects may not create problems as easily as if the traces were thinner.

Although the embodiments described above utilize higher resistivity conductive material, such material need not be used. If low resistivity material is used to form the wide traces, the line resistance can be made even lower. This reduced line resistance can produce a better coupling to ground (or some fixed potential) for the wide row traces, improving the noise shielding effectiveness of the rows. Alternatively, a low resistance material can be used with the traces widths kept thin. The thin metal traces can enable a reduction in the width of the touch sensor panel. For example, a thinned three-sub-layer stackup including low resistance material can be used, and in some cases may be less expensive than to develop an alternate chemistry two-layer stackup.

Figure 2B:
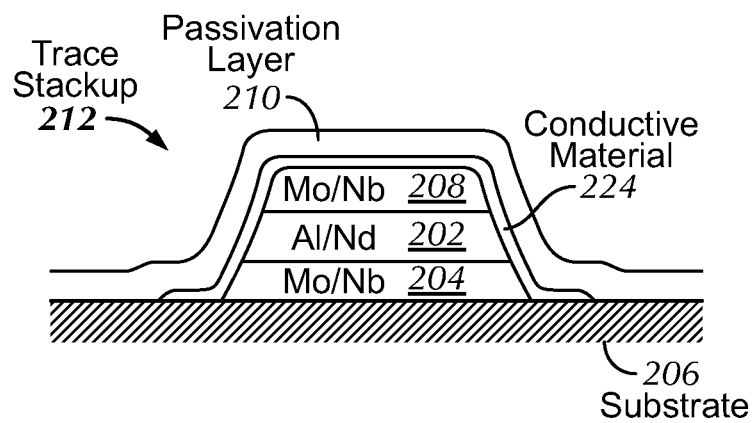
FIG. 2b illustrates an exemplary stackup of low resistivity material that can be used to form thinned traces in the border areas of a touch sensor panel according to embodiments of the invention.

FIG. 2b illustrates an exemplary stackup 212 of low resistivity material that can be used to form thinned traces in the border areas of a touch sensor panel according to embodiments of the invention. In the example of FIG. 2b, the primary conductive trace used for carrying the signal of interest can be a layer of Aluminum Neodymium (Al/Nd) 202, although other materials with similar properties can also be used. (The signal of interest, as defined herein, includes but is not limited to alternating current (AC) signals, direct current (DC) signals at a substantially constant voltage, and pulse or other momentary perturbations in a DC signal.) Because Al/Nd does not adhere well to substrate 206, a layer of Molybdenum Niobium (Mo/Nb) 204, another metal, can be first formed on substrate 206 to enhance the adhesion of the Al/Nd to the substrate, although other materials with similar properties can also be used. Al/Nd layer 202 can then be formed over Mo/Nb layer 204. A second layer of Mo/Nb 208 (or other similar material) can then be formed over Al/Nd layer 202 as an additional measure of protection from the atmosphere for the Al/Nd, which is highly corrosive. These three layers can be applied in essentially one step as an in-line process, with three chambers used to apply each layer in successive fashion. The three layers can then be etched together to form the traces, although in other embodiments, each of the three layers can be applied and patterned individually before the next layer is applied. A layer of conductive material 224 such as ITO can then be formed over the three-layer stackup. Conductive material layer 224 can be patterned to form the drive or sense lines that couple to the metal traces, and can also be patterned over the three-layer stackup to form another protective layer for the stackup. First passivation layer 210 of a material that can be sputtered (e.g. $SiO_2$) can then be applied over the traces to protect the formed traces, although other materials with similar properties can also be used.

Figure 3:
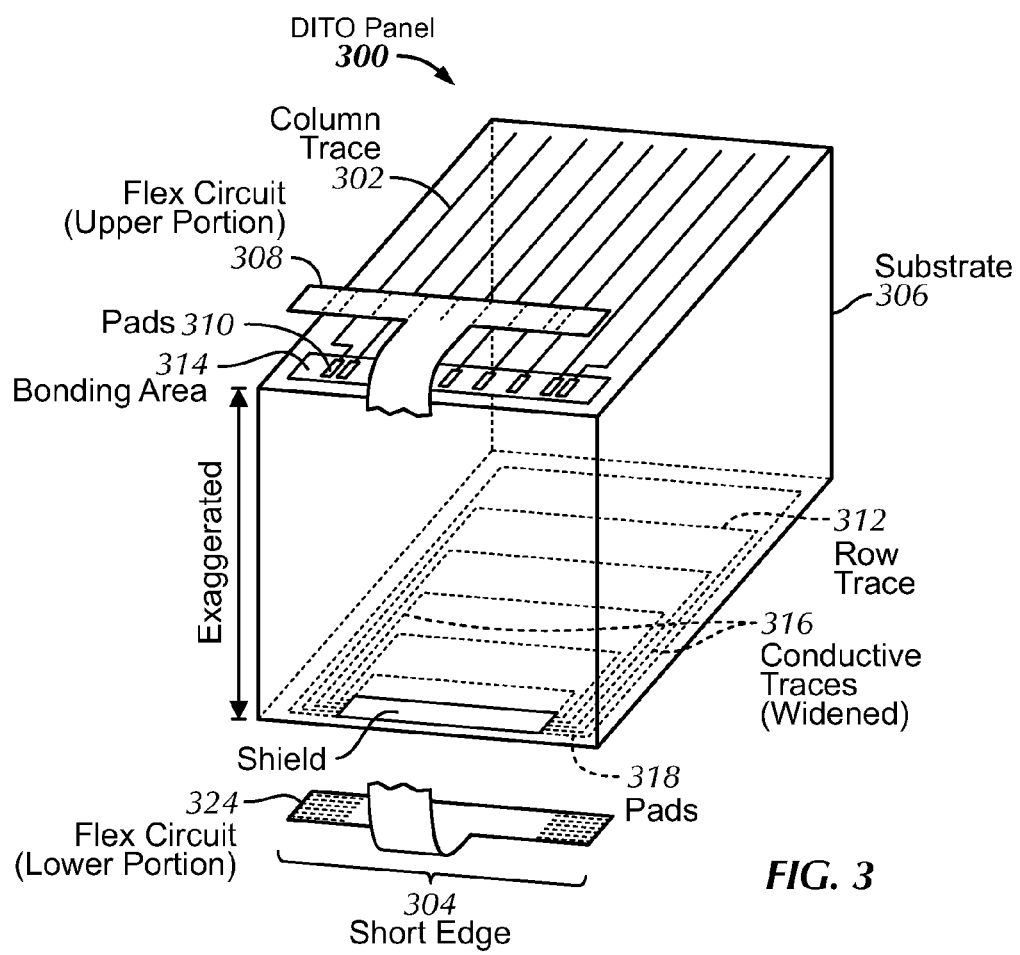
FIG. 3 illustrates an exemplary double-sided ITO (DITO) touch sensor panel having wide conductive traces in the border areas of the touch sensor panel according to embodiments of the invention.

FIG. 3 illustrates an exemplary DITO touch sensor panel 300 having widened conductive traces 316 (shown symbolically as dashed lines) in the border areas of the touch sensor panel according to embodiments of the invention. As shown in FIG. 3 (with the z-direction greatly exaggerated for clarity of illustration), DITO multi-touch sensor panel 300 can have column traces 302 (e.g. sense lines) that can terminate at a short edge 304 of substrate 306, requiring flex circuit 324 having wide flex circuit portion 308 extending the full width of the short edge that can bond to bond pads 310 on the top side of the substrate.

It can be undesirable to have column traces 302 (e.g. sense lines) and row traces 312 (e.g. drive lines) cross over each other at bonding area 314, and it can also be undesirable to have bond pads 310 and 318 formed on directly opposing sides of substrate 306 because such areas can generate unwanted stray mutual capacitance and coupling of signals. Therefore, row traces 312 can be routed to the same short edge 304 of substrate 306 as column traces 302 using wide conductive traces 316 (represented symbolically as thin lines) running along the borders of the substrate.

Figure 4:
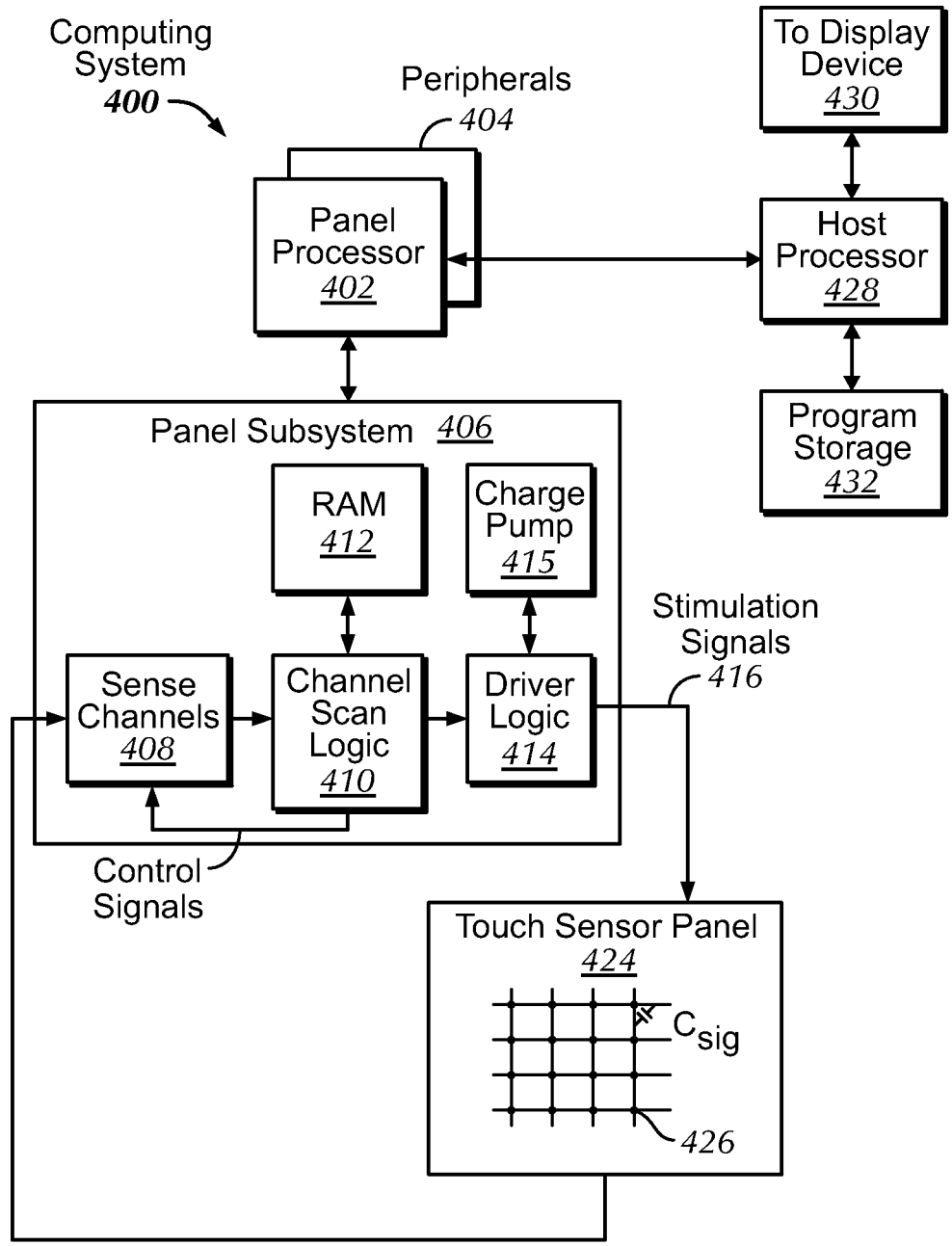
FIG. 4 illustrates an exemplary computing system including a touch sensor panel utilizing improved metal traces in the border areas according to embodiments of the invention.

FIG. 4 illustrates exemplary computing system 400 that can include one or more of the embodiments of the invention described above. Computing system 400 can include one or more panel processors 402 and peripherals 404, and panel subsystem 406. Peripherals 404 can include, but are not limited to, random access memory (RAM) or other types of memory or storage, watchdog timers and the like. Panel subsystem 406 can include, but is not limited to, one or more sense channels 408, channel scan logic 410 and driver logic 414. Channel scan logic 410 can access RAM 412, autonomously read data from the sense channels and provide control for the sense channels. In addition, channel scan logic 410 can control driver logic 414 to generate stimulation signals 416 at various frequencies and phases that can be selectively applied to drive lines of touch sensor panel 424. In some embodiments, panel subsystem 406, panel processor 402 and peripherals 404 can be integrated into a single application specific integrated circuit (ASIC).

Touch sensor panel 424 can include a capacitive sensing medium having a plurality of drive lines and a plurality of sense lines, although other sensing media can also be used. Either or both of the drive and sense lines can be coupled to wide conductive traces according to embodiments of the invention. Each intersection of drive and sense lines can represent a capacitive sensing node and can be viewed as picture element (pixel) 426, which can be particularly useful when touch sensor panel 424 is viewed as capturing an "image" of touch. (In other words, after panel subsystem 404 has determined whether a touch event has been detected at each touch sensor in the touch sensor panel, the pattern of touch sensors in the multi-touch panel at which a touch event occurred can be viewed as an "image" of touch (e.g. a pattern of fingers touching the panel).) Each sense line of touch sensor panel 424 can drive sense channel 408 (also referred to herein as an event detection and demodulation circuit) in panel subsystem 406.

Computing system 400 can also include host processor 428 for receiving outputs from panel processor 402 and performing actions based on the outputs that can include, but are not limited to, moving an object such as a cursor or pointer, scrolling or panning, adjusting control settings, opening a file or document, viewing a menu, making a selection, executing instructions, operating a peripheral device coupled to the host device, answering a telephone call, placing a telephone call, terminating a telephone call, changing the volume or audio settings, storing information related to telephone communications such as addresses, frequently dialed numbers, received calls, missed calls, logging onto a computer or a computer network, permitting authorized individuals access to restricted areas of the computer or computer network, loading a user profile associated with a user's preferred arrangement of the computer desktop, permitting access to web content, launching a particular program, encrypting or decoding a message, and/or the like. Host processor 428 can also perform additional functions that may not be related to panel processing, and can be coupled to program storage 432 and display device 430 such as an LCD display for providing a UI to a user of the device. Display device 430 together with touch sensor panel 424, when located partially or entirely under the touch sensor panel, can form touch screen 418.

Note that one or more of the functions described above can be performed by firmware stored in memory (e.g. one of the peripherals 404 in FIG. 4) and executed by panel processor 402, or stored in program storage 432 and executed by host processor 428. The firmware can also be stored and/or transported within any computer-readable medium for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable medium" can be any medium that can contain or store the program for use by or in connection with the instruction execution system, apparatus, or device. The computer readable medium can include, but is not limited to, an electronic, magnetic, optical, electromagnetic, infrared, or semiconductor system, apparatus or device, a portable computer diskette (magnetic), a random access memory (RAM) (magnetic), a read-only memory (ROM) (magnetic), an erasable programmable read-only memory (EPROM) (magnetic), a portable optical disc such a CD, CD-R, CD-RW, DVD, DVD-R, or DVD-RW, or flash memory such as compact flash cards, secured digital cards, USB memory devices, memory sticks, and the like.

The firmware can also be propagated within any transport medium for use by or in connection with an instruction execution system, apparatus, or device, such as a computer-based system, processor-containing system, or other system that can fetch the instructions from the instruction execution system, apparatus, or device and execute the instructions. In the context of this document, a "transport medium" can be any medium that can communicate, propagate or transport the program for use by or in connection with the instruction execution system, apparatus, or device. The transport readable medium can include, but is not limited to, an electronic, magnetic, optical, electromagnetic or infrared wired or wireless propagation medium.

Figure 5A:
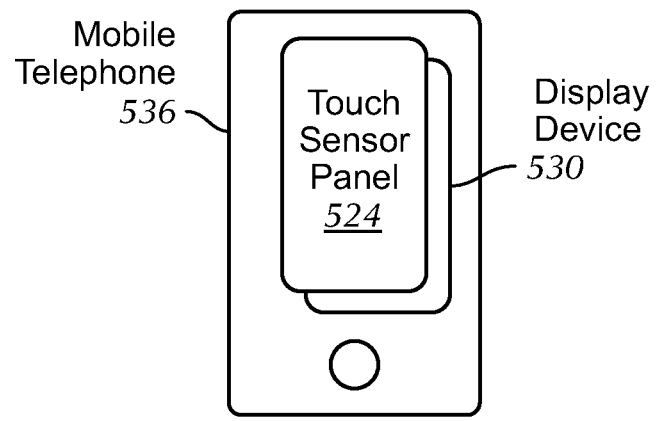
FIG. 5a illustrates an exemplary mobile telephone having a touch sensor panel that includes improved metal traces in the border areas according to embodiments of the invention.

FIG. 5*a* illustrates exemplary mobile telephone 536 that can include touch sensor panel 524 and display device 530, the touch sensor panel including the conductive traces formed in the border areas of the touch sensor panel according to embodiments of the invention.

Figure 5B:
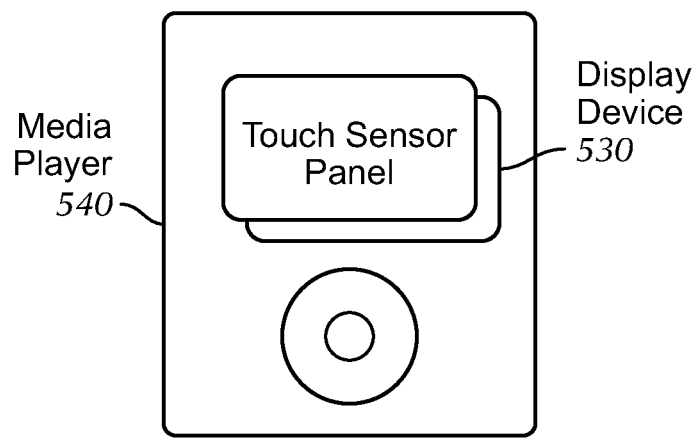
FIG. 5b illustrates an exemplary digital media player having a touch sensor panel that includes improved traces in the border areas according to embodiments of the invention.

FIG. 5*b* illustrates exemplary digital media player 540 that can include touch sensor panel 524 and display device 530, the touch sensor panel including improved reliability conductive traces according to embodiments of the invention.

Although embodiments of this invention have been fully described with reference to the accompanying drawings, it is to be noted that various changes and modifications will become apparent to those skilled in the art. Such changes and modifications are to be understood as being included within the scope of embodiments of this invention as defined by the appended claims.

What is claimed is:

1. A touch sensor panel comprising:
   a substrate;
   a first layer of a first conductive material supported on a first side of the substrate to form one or more rows;
   a second layer of the first conductive material supported on a second side of the substrate to form one or more columns; and
   a stackup of a second conductive material disposed on a portion of the first side of the substrate and on a portion of the one or more rows in one or more border areas of the touch sensor panel to form one or more conductive traces for off-panel connections, wherein at least one trace has segments of varying width along the length of the trace, respective trace widths within each segment are constant, and respective trace widths in areas between segments along the length of the trace are non-constant,
   further wherein the one or more rows and the one or more columns form a plurality of capacitive sensing nodes.

2. The touch sensor panel of claim 1, further comprising a passivation layer disposed on at least one of the first and second side of the substrate.

3. The touch sensor panel of claim 1, wherein the second conductive material has a resistivity greater than about 0.4 ohms per square.

4. The touch sensor panel of claim 1, wherein the stackup is comprised from Molybdenum/Niobium (Mo/Nb).

5. The touch sensor panel of claim 1, wherein the stackup is comprised from Molybdenum/Niobium (Mo/Nb), Aluminum Neodymium (Al/Nd) and Mo/Nb.

6. The touch sensor panel of claim 1, wherein the one or more traces are configured to occupy substantially a full width of the border area.

7. The touch sensor panel of claim 1, wherein the traces are coupled to every other row in an interleaved manner such that at least one trace is present along a full length of the border area.

8. The touch sensor panel of claim 1, wherein the one or more traces in any particular portion of the border area alongside a row have substantially the same width.

9. The touch sensor panel of claim 1, further comprising a computing system that incorporates the touch sensor panel.

10. The touch sensor panel of claim 9, further comprising a mobile telephone that incorporates the computing system.

11. The touch sensor panel of claim 9, further comprising a digital audio player that incorporates the computing system.

12. A touch sensor panel comprising:
a first layer of a first conductive material supported on a first substrate to form one or more rows;
a second layer of the first conductive material supported on a second substrate to form one or more columns; and
a stackup of a second conductive material disposed on a portion of the first substrate and on a portion of the one or more rows in one or more border areas of the touch sensor panel to form one or more conductive traces for off-panel connections, wherein at least one trace has segments of varying width along the length of the trace, respective trace widths within each segment are constant, and respective trace widths in areas between segments along the length of the trace are non-constant, further wherein the one or more rows and the one or more columns form a plurality of capacitive sensing nodes.

13. The touch sensor panel of claim 12, further comprising a passivation layer disposed on at least one of the first and second side of the substrate.

14. The touch sensor panel of claim 13, further comprising a computing system that incorporates the touch sensor panel.

15. The touch sensor panel of claim 14, further comprising a mobile telephone that incorporates the computing system.

16. The touch sensor panel of claim 14, further comprising a digital audio player that incorporates the computing system.

* * * * *